US011424178B2

(12) United States Patent
Kondo et al.

(10) Patent No.: US 11,424,178 B2
(45) Date of Patent: Aug. 23, 2022

(54) SEMICONDUCTOR MODULE

(71) Applicant: Mitsubishi Electric Corporation, Tokyo (JP)

(72) Inventors: Satoshi Kondo, Tokyo (JP); Hidetoshi Ishibashi, Tokyo (JP); Hiroshi Yoshida, Tokyo (JP); Nobuhiro Asaji, Tokyo (JP); Junji Fujino, Tokyo (JP); Yusuke Ishiyama, Tokyo (JP); Hodaka Rokubuichi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/844,199

(22) Filed: Apr. 9, 2020

(65) Prior Publication Data
US 2021/0066175 A1  Mar. 4, 2021

(30) Foreign Application Priority Data
Sep. 3, 2019  (JP) .............................. JP2019-160675

(51) Int. Cl.
| H01L 29/15 | (2006.01) |
| H01L 23/498 | (2006.01) |
| H01L 23/18 | (2006.01) |
| H05K 3/10 | (2006.01) |
| H05K 3/34 | (2006.01) |
| H05K 3/30 | (2006.01) |

(Continued)

(52) U.S. Cl.
CPC ........ *H01L 23/49811* (2013.01); *H01L 23/18* (2013.01); *H01L 23/28* (2013.01); *H01L 24/05* (2013.01); *H01L 24/48* (2013.01); *H01L 24/73* (2013.01); *H05K 3/103* (2013.01); *H05K 3/303* (2013.01); *H05K 3/341* (2013.01); *H01L 2224/05* (2013.01); *H01L 2224/32* (2013.01); *H01L 2224/45* (2013.01); *H01L 2224/48091* (2013.01); *H01L 2224/73265* (2013.01); *H05K 2201/10287* (2013.01)

(58) Field of Classification Search
None
See application file for complete search history.

(56) References Cited

U.S. PATENT DOCUMENTS 9,786,587 B2 * 10/2017 Nishizawa .......... H01L 23/3735
10,163,868 B2 * 12/2018 Horio .................. H01L 23/3121
(Continued)

FOREIGN PATENT DOCUMENTS

| JP | 2014-107378 A | 6/2014 |
| JP | 2016-029688 A | 3/2016 |
| JP | 2016-092346 A | 5/2016 |

*Primary Examiner* — Hung K Vu
(74) *Attorney, Agent, or Firm* — Studebaker & Brackett PC

(57) ABSTRACT

A semiconductor module includes: an insulated circuit board; a semiconductor device mounted on the insulated circuit board; a printed wiring board arranged above the insulated circuit board and the semiconductor device and having a through-hole; a metal pile having a lower end bonded to an upper surface of the semiconductor device and a cylindrical portion penetrating through the through-hole and bonded to the printed wiring board; a case surrounding the insulated circuit board, the semiconductor device, the printed wiring board and the metal pile; and a sealing material sealing an inside of the case.

8 Claims, 4 Drawing Sheets

(51) Int. Cl.
*H01L 23/00* (2006.01)
*H01L 23/28* (2006.01)

(56) References Cited

U.S. PATENT DOCUMENTS

2019/0295990 A1* 9/2019 Hayashi .................. H01L 23/36
2021/0043551 A1* 2/2021 Kim .................. H01L 23/49537

* cited by examiner ated circuit board, and a flat type copper wire bonded to an upper surface of the semiconductor device is made to penetrate through a through-hole of a printed wiring board and bonded thereto (for example, see FIG. 4 of JP 2016-29688 A).

SUMMARY

Conventionally, a semiconductor device inside a sealed module and a printed wiring board outside the module have been connected to each other, so that the accuracy of gap control between the semiconductor device and the printed wiring board has not been required. On the other hand, when a printed wiring board is incorporated inside a module, it is required to fill the gap between a semiconductor device and the printed wiring board with a sealing material, so that the accuracy of gap control between the semiconductor device and the printed wiring board is required.

An insulated circuit board may warp due to thermal stress. In particular, when semiconductor devices having different thicknesses are mounted on an insulated circuit board, a warp is apt to occur. The warp is a three-dimensional warp in all directions including not only a Z direction (vertical direction), but also X and Y directions (lateral direction). However, a flat type copper wire is a parallel flat plate, so that it has high rigidity in the X and Y directions and is hardly deformed. Therefore, flat type copper wires have been capable of following the warp in the vertical direction, but have been difficult to follow the warp in the X and Y directions.

In a prior art, flat type copper wires are folded, and thus there is a residual stress of press-back or bending or the like, so that it is difficult to make the height uniform, and it is difficult to perform the gap control between a semiconductor device and a printed wiring board. When the interval between the folded copper wires is increased, the height can be easily made uniform, but the height increases, so that the copper wires cannot be accommodated in a package. Furthermore, the folded copper wires are arranged adjacent to each other so that current flowing directions thereof are opposite to each other, and thus have an effect of reducing self-inductance. However, when the interval between the folded copper wires is increased, the effect is reduced.

As described above, when a semiconductor device and a printed wiring board are connected to each other by using the conventional flat type copper wire, it has been difficult to perform the gap control between the semiconductor device and the printed wiring board. For this reason, there has been a problem that when a printed wiring board is incorporated in a module, filling performance of the sealing material is reduced and insulation performance and structural reliability are deteriorated.

The present disclosure has been made to solve the above-described problem, and has an object to obtain a semiconductor module capable of enhancing insulation performance and structural reliability.

A semiconductor module according to the present disclosure includes: an insulated circuit board; a semiconductor device mounted on the insulated circuit board; a printed wiring board arranged above the insulated circuit board and the semiconductor device and having a through-hole; a metal pile having a lower end bonded to an upper surface of the semiconductor device and a cylindrical portion penetrating through the through-hole and bonded to the printed wiring board; a case surrounding the insulated circuit board, the semiconductor device, the printed wiring board and the metal pile; and a sealing material sealing an inside of the case.

In the present disclosure, the cylindrical portion of the metal pile penetrates through the through-hole and is bonded to the printed wiring board. The cylindrical portion moves with respect to the through-hole, so that the metal pile and the printed wiring board can follow the warp of the insulated circuit board in the vertical direction. Further, the cylindrical portion is easily deformed in the lateral direction. Therefore, the metal pile and the printed wiring board can follow omnidirectional three-dimensional warps of the insulated circuit board. Accordingly, the gap between the insulated circuit board and the printed wiring board can be controlled. As a result, the filling performance of the sealing material is enhanced, so that the insulation performance and the structural reliability can be improved.

Other and further objects, features and advantages of the disclosure will appear more fully from the following description.

DESCRIPTION OF EMBODIMENTS

A semiconductor module according to the embodiments of the present disclosure will be described with reference to the drawings. The same components will be denoted by the same symbols, and the repeated description thereof may be omitted.

First Embodiment

Figure 1:
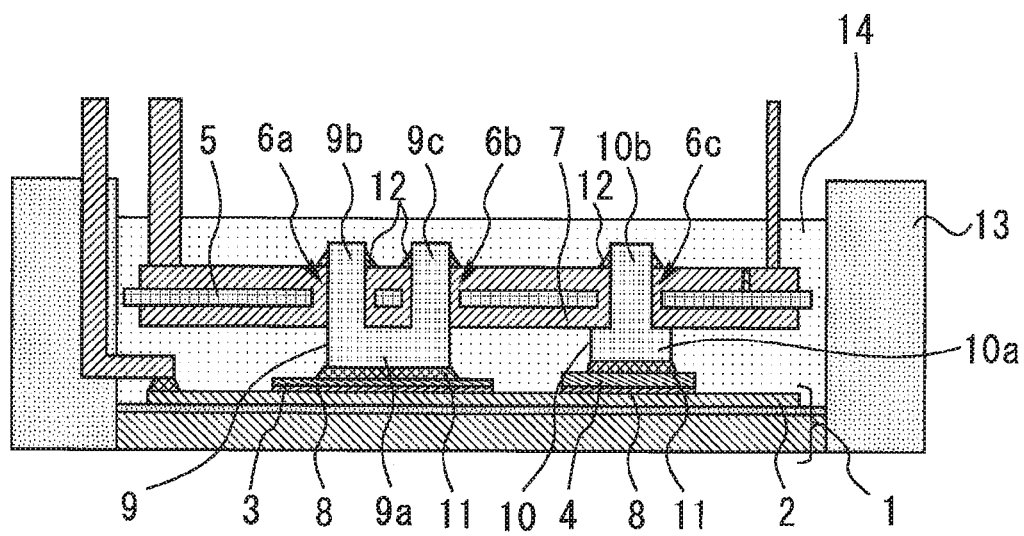
FIG. 1 is a cross-sectional view showing a semiconductor module according to a first embodiment.

FIG. 1 is a cross-sectional view showing a semiconductor module according to a first embodiment. A circuit pattern 2 is formed on a surface of an insulated circuit board 1 insulated with resin. Semiconductor devices 3 and 4 are mounted on the insulated circuit board 1. For example, the semiconductor device 3 is an insulated gate bipolar transistor (IGBT). The semiconductor device 4 is a free wheel diode (FWDi). The thickness of the semiconductor device 3 is 0.1 mm, the thickness of the semiconductor device 4 is 0.3 mm, and both the semiconductor devices are different in thickness. Note that electronic components other than the semiconductor devices 3 and 4 may be mounted on the insulated circuit board 1.

A printed wiring board 5 is arranged above the insulated circuit board 1 and the semiconductor devices 3 and 4. The printed wiring board 5 has through-holes 6a, 6b, and 6c and a circuit pattern 7 of one or more layers. The semiconductor devices 3 and 4 are bonded to the circuit pattern 2 of the insulated circuit board 1 by a die bonding material 8. Metal piles 9 and 10 having different shapes are bonded to the upper surfaces of the semiconductor devices 3 and 4 with a bonding material 11, respectively.

Figure 2:
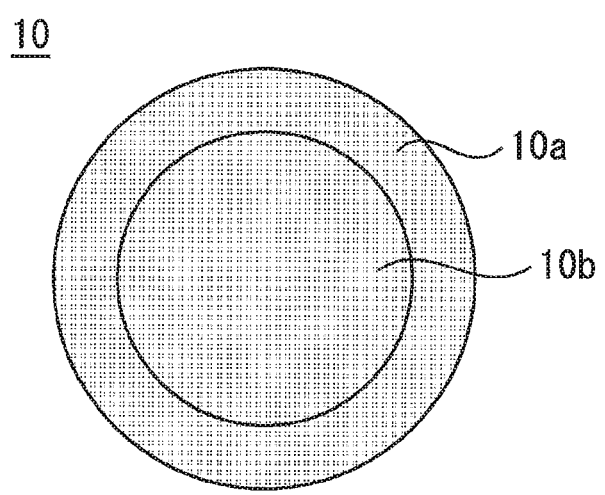
FIG. 2 is a top view of the metal pile.

The metal pile 9 has a base section 9a having a large cross-sectional area, and cylindrical portions 9b and 9c which are two portions branched from the base section 9a. The two cylindrical portions 9b and 9c penetrate through the two through-holes 6a and 6b respectively, and are bonded to the circuit pattern 7 of the printed wiring board 5. FIG. 2 is a top view of the metal pile 10. The metal pile 10 has a base portion 10a bonded to the semiconductor device 4, and a cylindrical portion 10b which penetrates through the through-hole 6c and is bonded to the circuit pattern 7 with a bonding material 12.

Here, in an assembling process of the semiconductor module, the metal piles 9 and 10 are first bonded to the upper surfaces of the semiconductor devices 3 and 4 with the bonding material 11, respectively. Next, the metal piles 9 and 10 are made to penetrate through the through-holes 6a, 6b, and 6c of the printed wiring board 5, and bonded to the circuit pattern 7 with the bonding material 12. At this time, the bonding materials 11 and 12 are simultaneously melted. A warp occurs in the insulated circuit board 1 due to a difference in thermal expansion coefficient between the insulated circuit board 1 and the semiconductor devices 3 and 4. The metal piles 9, 10 which have adhered to the bonding material 11 melted on the upper surfaces of the semiconductor devices 3, 4 by surface tension follow the warp of the insulated circuit board 1.

A case 13 surrounds the insulated circuit board 1, the semiconductor devices 3 and 4, the printed wiring board 5, and the metal piles 9 and 10. In order to protect the insulated circuit board 1, the semiconductor devices 3 and 4 and the printed wiring board 5, the inside of the case 13 is sealed with a sealing material 14. The sealing material 14 is an insulating sealing material such as hard epoxy resin. The viscosity of the hard epoxy resin is about 20 to 50 Pa·s, which is about 10 to 100 times as larger as the viscosity of 0.5 to 2 Pa·s of silicone gel which is a general sealing material. It is necessary that the sealing material 14 as described above is filled in regions above the semiconductor devices 3 and 4, which are narrowest portions between the insulated circuit board 1 and the printed wiring board 5. Therefore, a gap of at least 200 μm or more is required in consideration of the difficulty in fluidity of the sealing material 14 and the large viscosity of the sealing material 14. Note that the required gap size is related to withstanding voltages of the semiconductor devices 3 and 4.

For example, when the material of the circuit pattern 2 of the insulated circuit board 1 is Cu, the thermal expansion coefficient is equal to 17. When the material of the semiconductor devices 3 and 4 is SiC, the thermal expansion coefficient is equal to 7. This difference in thermal expansion coefficient causes occurrence of a warp or distortion in the insulated circuit board 1 at temperatures at which the bonding material 11 is melted and cured. For this reason, the gaps between the semiconductor devices 3 and 4 and the printed wiring board 5 become uneven.

On the other hand, in the present embodiment, the cylindrical portions 9b, 9c, 10b of the metal piles 9 and 10 penetrate through the through-holes 6a, 6b, and 6c of the printed wiring board 5, and are bonded to the circuit pattern 7. The cylindrical portions 9b, 9c, and 10b move with respect to the through-holes 6a, 6b, and 6c while the bonding material 12 is melted, so that the metal piles 9 and 10 and the printed wiring board 5 can follow the warp of the insulated circuit board 1 in the vertical direction. Further, the cylindrical portions 9b, 9c, and 10b are easily deformed in the lateral direction. Therefore, the metal piles 9 and 10 and the printed wiring board 5 can follow omnidirectional three-dimensional warps of the insulated circuit board 1. Accordingly, the gap between the insulated circuit board 1 and the printed wiring board 5 can be controlled, and a uniform gap of about 200 μm to 2 mm can be stably obtained as designed. As a result, the filling performance of the sealing material 14 is enhanced, and the sealing material 14 is sufficiently filled in the gap without causing non-filling of the sealing material 14 by bubbles or the like, so that the insulation performance and the structural reliability can be improved.

Further, in the prior art, a wiring terminal is fixed with a sealing material while being deformed due to a warp of a board, and is connected to a printed wiring board outside a module. Therefore, it has been required to increase the diameters of through-holes of the printed wiring board. On the other hand, in the present embodiment, the printed wiring board 5 is incorporated in the module, so that sealing is performed after the printed wiring board 5 and the metal piles 9 and 10 are bonded to each other. Furthermore, the metal piles 9 and 10 and the printed wiring board 5 can follow the warp of the insulated circuit board 1 as described above, so that the diameters of the through-holes 6a, 6b, and 6c of the printed wiring board 5 are not required to be so large.

When a plurality of semiconductor devices 3 and 4 having different thicknesses are mounted on the insulated circuit board 1, the insulated circuit board 1 is apt to warp. Therefore, following the warp is particularly important. Further, a conventional wiring terminal obtained by folding a flat type copper wire has a long wiring length and a large electric resistance. On the other hand, the metal piles 9 and 10 are suitable for a semiconductor module in which large current flows because the metal piles 9 and 10 can shorten the wiring length and reduce the electric resistance.

When a current is made to flow by using the through-holes of the printed wiring board 5 in a power semiconductor for controlling several tens to several hundreds of amperes, the metal pile 9 having a forked structure is effective. The cross-sectional shape of the metal pile 10 is an inverted T-shape. The width of the cylindrical portion 10b on the upper side of the metal pile 10 is smaller than the width of the through-hole 6c, whereby a gap between them is secured. A range of following the warp of the insulated circuit board 1 is determined by this gap. On the other hand, the width of the base portion 10a on the lower side of the metal pile 10 is larger than the width of the through-hole 6c. Since the base portion 10a serves as a stopper for preventing the printed wiring board 5 from dropping, a gap between the insulated circuit board 1 and the printed wiring board 5 can be secured. In addition, since the bonding area between the metal pile 10 and the semiconductor device 4 is increased, heat radiation from the semiconductor device 4 is enhanced.

It is preferable that the melting point of the bonding material 11 is set to be higher than the melting point of the bonding material 12. Thus, after the temperature is increased in a heating furnace or the like to melt both the materials, the bonding material 11 is earlier solidified when the temperature decreases, and the bonding material 12 is still molten. Accordingly, the metal piles 9 and 10 can move freely in the through-holes 6a, 6b, and 6c of the printed wiring board 5, so that the metal piles 9 and 10 and the printed wiring board 5 can follow the warp in the vertical direction of the insulated circuit board 1. Furthermore, since no load is applied to the previously solidified bonding material 11, it is possible to avoid bonding failure of the bonding material 11. In addition, since the bonding material 11 for bonding the semiconductor devices 3 and 4 and the metal piles 9 and 10 is earlier solidified, it is possible to prevent positional displacement of the metal piles 9 and 10 with respect to the semiconductor devices 3 and 4.

When a signal electrode such as a gate electrode is increased in size on the upper surface of the semiconductor device 3, the area of an electrode for power such as an emitter electrode decreases correspondingly, which deteriorates the performance as the power semiconductor device. Accordingly, high positional accuracy is required for the bonding of the metal pile to a signal electrode because the area of the signal electrode cannot be increased. The present embodiment is also effective to the bonding of the metal pile to the signal electrode as described above.

Second Embodiment

Figure 3:
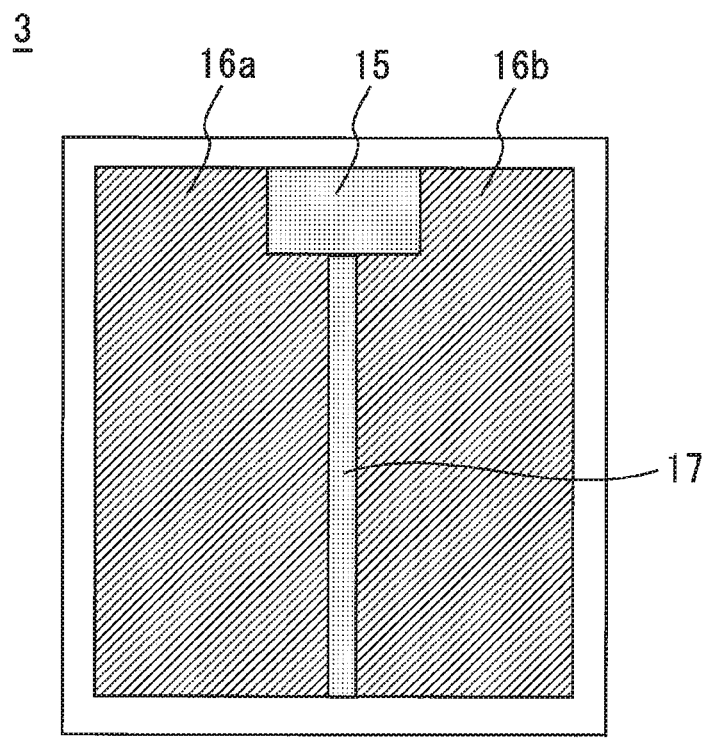
FIG. 3 is a top view of the semiconductor device.

FIG. 3 is a top view of the semiconductor device. The semiconductor device 3 is an IGBT chip having a large size for making large current flow. A gate electrode 15 which is a signal electrode through which a control signal flows is provided on the upper surface of the semiconductor device 3. Emitter electrodes 16a and 16b which are power electrodes through which large current flows are provided separately from each other on the upper surface of the semiconductor device 3. A partition line 17 is formed between the emitter electrodes 16a and 16b. The partition line 17 is set to a potential different from that of an energization area, and thus if the partition line 17 and the energization area come into contact with each other, the semiconductor device 3 would not function.

Figure 4:
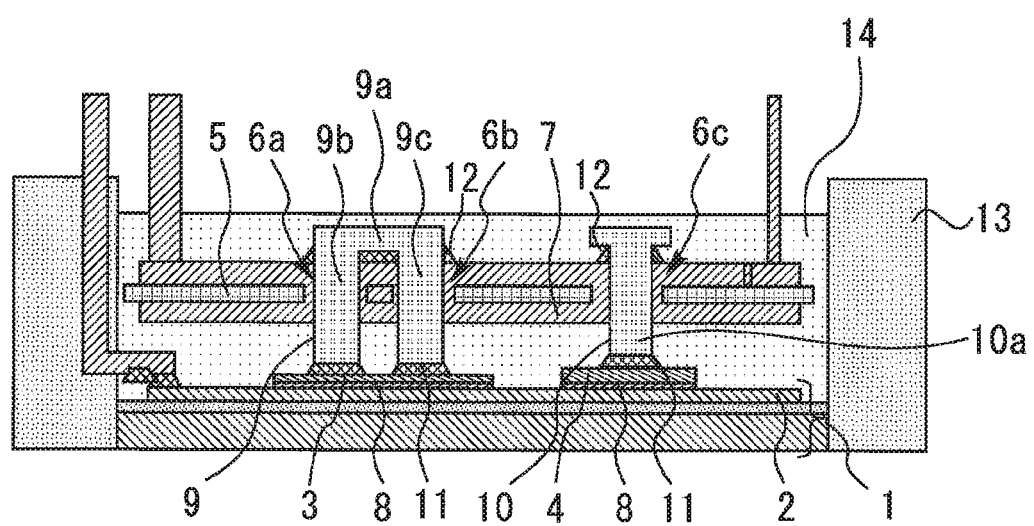
FIG. 4 is a cross-sectional view showing a semiconductor apparatus according to a second embodiment.

FIG. 4 is a cross-sectional view showing a semiconductor apparatus according to a second embodiment. The cylindrical portions 9b and 9c of the metal pile 9 which extend downward are inserted in the through-holes 6a and 6b respectively with the base section 9a of the metal pile 9 facing upward. The tips of the cylindrical portions 9b and 9c am bonded to the emitter electrodes 16a and 16b respectively without contacting the partition line 17 of the semiconductor device 3. As a result, the bonding area between the metal pile 9 and the semiconductor device 3 can be increased, which is advantageous for the bonding to the semiconductor device 3 adaptable to large current. The other configurations and effects are similar to those of the first embodiment.

Note that the cross-sectional shape of the metal pile 10 is T-shaped unlike the first embodiment, and thus there is no stopper for preventing the printed wiring board 5 from dropping. Therefore, the printed wiring board 5 may be fixed to and supported by the case 13 in order to secure a gap between the insulated circuit board 1 and the printed wiring board 5. Alternatively, the gap may be secured by using the metal pile 10 having the inverted T-shape of the first embodiment.

Third Embodiment

Figure 5:
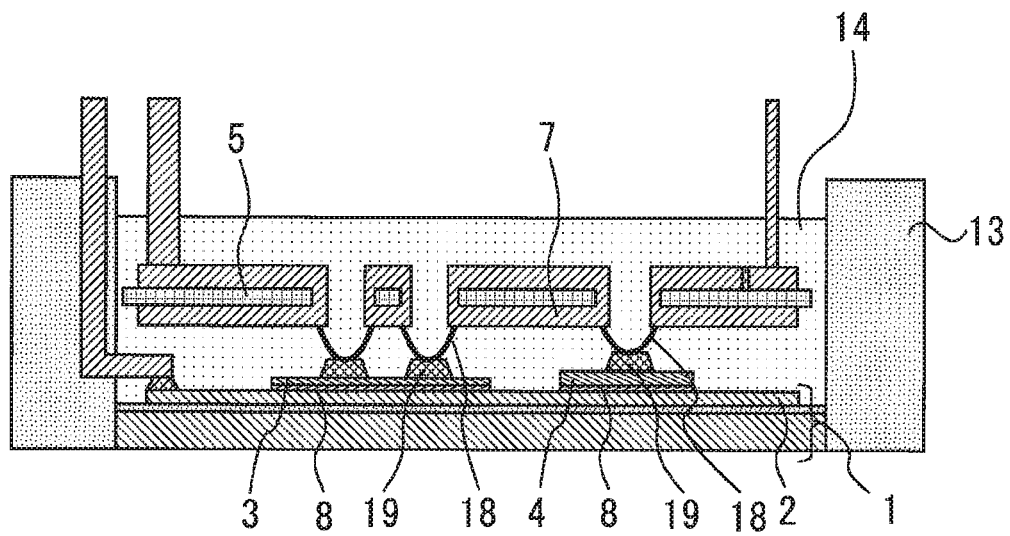
FIG. 5 is a cross-sectional view showing a semiconductor apparatus according to a third embodiment.

FIG. 5 is a cross-sectional view showing a semiconductor apparatus according to a third embodiment. In the present embodiment, metal wires 18 are used instead of the metal piles 9 and 10. Each of the metal wires 18 is connected to the circuit pattern 7 on the lower surface of the printed wiring board 5 at both ends thereof, and hangs downward. The metal wires 18 which have been controlled to have a required height in advance are bonded to the printed wiring board 5. The downward hanging portions of the metal wires 18 are bonded to the upper surfaces of the semiconductor devices 3 and 4 by a bonding material 19. The metal wires 18 are made of a material which can be bonded to the bonding material 19, and are, for example, Cu wires.

In the present embodiment, by controlling the heights of the metal wires 18, the gap between the printed wiring board 5 and the insulated circuit board 1 can be arbitrarily set. Accordingly, the filling performance of the sealing material 14 is enhanced, and the insulation performance and the structural reliability can be improved. The height of the metal wire 18 is more easily controlled than a leaf spring structure. Therefore, even when a plurality of bonded portions are present, the control of the height can be individually performed.

Note that when a plurality of metal wires 18 are used, the printed wiring board 5 can be supported by only the metal wires 18, but the printed wiring board 5 may be fixed to and supported by the case 13. Furthermore, a plurality of metal wires 18 may be bonded to a power electrode through which large current flows, whereas one metal wire 18 is bonded to a signal electrode through which small current flows. As a result, the configuration of the present embodiment can also be applied to connection of a signal electrode generally having a small area. The diameter of the Cu wire is in a range between 200 µm and 500 µm, but it is selected together with the number of wires determined by the rated currents of the semiconductor devices 3 and 4. As described above, since the diameter of the metal wire 18 is large and a certain degree of rigidity can be obtained, an influence of the filling of the sealing material 14, for example, deformation of the metal wire 18 does not occur.

Fourth Embodiment

Figure 6:
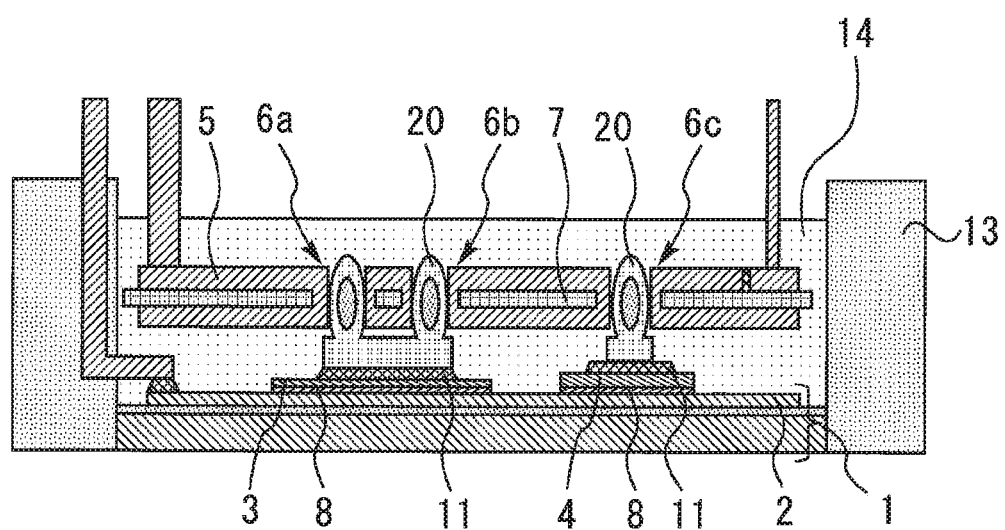
FIG. 6 is a cross-sectional view showing a semiconductor module according to a fourth embodiment.

FIG. 6 is a cross-sectional view showing a semiconductor module according to a fourth embodiment. In the present embodiment, press-fits 20 are used instead of the metal piles 9 and 10. The press-fit 20 is also called a tulip press, and lower ends of the press-fits 20 are bonded to the upper surfaces of the semiconductor devices 3 and 4 by the bonding material 11, and press-fit portions thereof are directly press-fitted into the through-holes 6a, 6b, and 6c. Before press-fitted, the press-fits 20 have widths larger than the diameters of the through-holes 6a, 6b, and 6c. The contacts between the press-fits 20 and the through-holes 6a, 6b, and 6c am maintained under pressure caused by elastic deformation of the press-fitted press-fits 20.

By using the press-fits 20, it is possible to perform electrical connection with the printed wiring board 5 without using the bonding material 12. For this reason, it is possible to perform the connection in a normal temperature state, and it is unnecessary to increase the temperature for melting the bonding material 12 during assembly. Therefore, the assembly is simplified, and productivity is excellent. Since the press-fits 20 can be easily attached and detached, the press-fits 20 are effective when it is required to replace the printed wiring board 5. The other configurations and effects are similar to those of the first embodiment.

Fifth Embodiment

Figure 7:
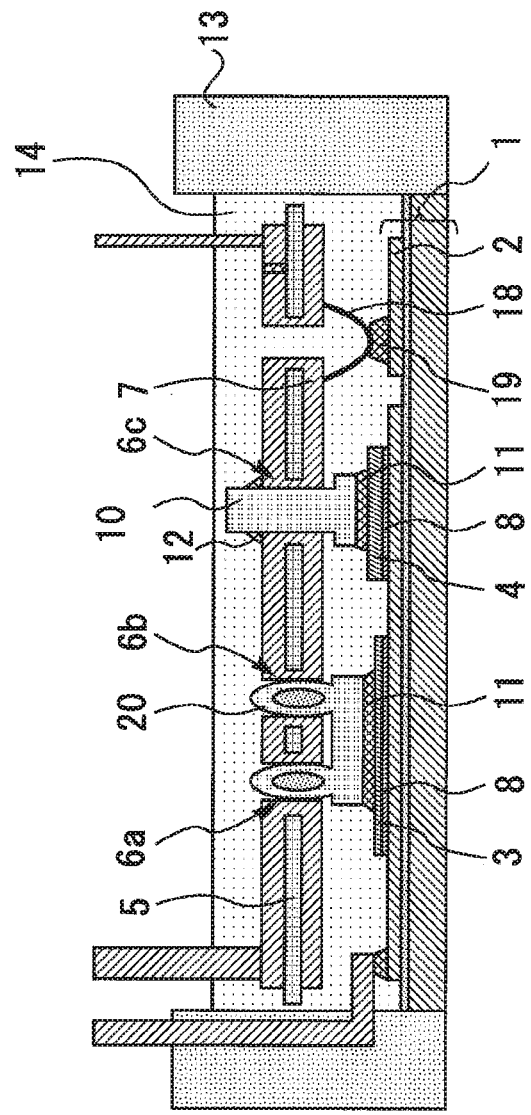
FIG. 7 is a cross-sectional view showing a semiconductor module according to a fifth embodiment.

FIG. 7 is a cross-sectional view showing a semiconductor module according to a fifth embodiment. The present embodiment includes all of the metal piles 9 and 10 having the cylindrical portions 9b, 9c and 10b of the first or second embodiment, the metal wires 18 of the third embodiment, and the press-fits 20 of the fourth embodiment.

As an application range of power semiconductor devices is expanding, a case where multiple circuits and semiconductor devices such as an Si device or SiC devices which are most suitable for the circuits are mixed and mounted in one power semiconductor apparatus will happen hereafter. In such a case, by combining the configurations of the first to fourth embodiments and selectively applying a combination, an internal circuit can be configured in an optimal space, and a highly integrated power semiconductor apparatus can be obtained.

In the present disclosure, within the scope of the disclosure the embodiments and modifications may be freely combined, and each embodiment may be appropriately modified or omitted. The insulated circuit board 1 is an insulated circuit board insulated by resin. However, the insulated circuit board 1 is not limited to the above mode, and may be an insulated circuit board made of a ceramic base material or a patterned lead frame. The semiconductor devices 3 and 4 are not limited to IGBTs, but may be metal oxide semiconductor field effect transistors (MOSFET). The sealing material 14 is not limited to hard epoxy resin, but may be a silicone-based sealing material, which can obtain similar effects. The die bonding material 8 and the bonding materials 11, 12, and 19 are generally solder. However, these materials are not limited to the above mode, and may be bonding materials containing sinterable Ag or Cu particles. By using a sinterable bonding material, the life of the bonded portions can be improved as compared with a case of solder bonding. When semiconductor devices 3 and 4 formed of wide band gap semiconductors capable of operating at a high temperature am used, in order to make use of the characteristics, an improvement of the life of bonded portions by using a sintered material is effective.

The semiconductor devices 3 and 4 are not limited to devices formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved. Both the semiconductor devices 3 and 4 are desirably formed of a wide-bandgap semiconductor. However, only one of the semiconductor devices 3 and 4 may be formed of a wide-bandgap semiconductor. Also in this case, the advantageous effects described in this embodiment can be obtained.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2019-160675, filed on Sep. 3, 2019 including specification, claims, drawings and summary, on which the convention priority of the present application is based, is incorporated herein by reference in its entirety.

The invention claimed is:
1. A semiconductor module comprising:
an insulated circuit board;
a semiconductor device mounted on the insulated circuit board;
a printed wiring board arranged above the insulated circuit board and the semiconductor device and having a through-hole;
a metal pile having a lower end bonded to an upper surface of the semiconductor device and a cylindrical portion penetrating through the through-hole and bonded to an upper surface of the printed wiring board by a bonding material;
a case surrounding the insulated circuit board, the semiconductor device, the printed wiring board and the metal pile; and
a sealing material sealing an inside of the case,
wherein a gap is present within the through-hole between a circumference of the cylindrical portion and a region of the printed wiring board defining the through-hole in a lateral direction.
2. The semiconductor module according to claim 1, wherein the metal pile has a base portion bonded to the upper surface of the semiconductor device, and
a width of the base portion is larger than a width of the through-hole.
3. The semiconductor module according to claim 1, wherein
the bonding material bonding the cylindrical portion to the upper surface of the printed wiring board is a first bonding material, and the semiconductor module further comprises a second bonding material bonding the metal pile to the semiconductor device,
wherein a melting point of the second bonding material is higher than a melting point of the first bonding material.
4. The semiconductor module according to claim 1, wherein the semiconductor device includes a plurality of devices having different thicknesses and mounted on the insulated circuit board.
5. The semiconductor module according to claim 1, wherein the semiconductor device is made of a wide-bandgap semiconductor.
6. The semiconductor module according to claim 1, wherein the bonding material is conductive.
7. A semiconductor module comprising:
an insulated circuit board;
a semiconductor device mounted on the insulated circuit board;
a printed wiring board arranged above the insulated circuit board and the semiconductor device and having a through-hole;

a metal pile having a lower end bonded to an upper surface of the semiconductor device and a cylindrical portion penetrating through the through-hole and bonded to the printed wiring board;

a case surrounding the insulated circuit board, the semiconductor device, the printed wiring board and the metal pile; and a sealing material sealing an inside of the case, wherein the metal pile has a base section and two cylindrical portions which are the cylindrical portion and branched from the base section, the base section abuts the printed wiring board, the printed wiring board has two through-holes which are the through-hole, and the two cylindrical portions penetrate through the two through-holes respectively and are bonded to the printed wiring board.

8. The semiconductor module according to claim 7, wherein the semiconductor device includes two power electrodes provided separately from each other on the upper surface, and the two cylindrical portions are bonded to the two power electrodes respectively.

\* \* \* \* \*